(12) United States Patent
Gibson

(10) Patent No.: US 6,369,693 B1
(45) Date of Patent: Apr. 9, 2002

(54) METHOD OF, AND SYSTEM FOR, TRANSFERRING SECURE DATA

(75) Inventor: Rodney W. Gibson, Haywards Heath (GB)

(73) Assignee: U.S. Philips Corporation, New York, NY (US)

( * ) Notice: Subject to any disclaimer, the term of this patent is extended or adjusted under 35 U.S.C. 154(b) by 923 days.

(21) Appl. No.: 08/512,239

(22) Filed: Aug. 7, 1995

(30) Foreign Application Priority Data

Aug. 9, 1994 (GB) .............................................. 9416040

(51) Int. Cl.⁷ ................................................ H04Q 1/00
(52) U.S. Cl. ......................... 340/5.8; 340/5.1; 340/5.8; 348/734; 359/142; 359/145; 359/148
(58) Field of Search ...................... 340/825.34, 825.31, 340/825.69, 825.72; 348/723, 725, 729, 734, 5.5; 380/24; 235/379, 380; 359/142, 145, 148; 455/151.1, 151.2, 151.4

(56) References Cited

U.S. PATENT DOCUMENTS

| 4,881,148 A | 11/1989 | Lambropoulos et al. .... 361/172 |
| 5,148,159 A | 9/1992 | Clark et al. ............ 340/825.22 |
| 5,410,326 A | * 4/1995 | Goldstein ................... 348/134 |
| 5,572,194 A | * 11/1996 | Shiota .................... 340/825.25 |

FOREIGN PATENT DOCUMENTS

| EP | 0385070 | 9/1990 | ........... E05B/49/00 |
| EP | 0524424 A1 | 1/1993 | ........... E05B/49/00 |

OTHER PUBLICATIONS

"Infrared Transmitter With Dual Power Levels", IBM Technical Disclosure Bulletin, vol. 29, No. 10, Mar. 1987, pp. 4527–4528.

* cited by examiner

Primary Examiner—Yonel Beaulieu
(74) Attorney, Agent, or Firm—Edward W. Goodman

(57) ABSTRACT

A method of transferring secure data in a remote control system including a remote controller (12) and an apparatus (10) which is operable in response to commands relayed by way of the remote controller. The apparatus has a receiver (38) for receiving transmissions from the remote controller (12), the information from the transmissions being stored in a storage device (42). The remote controller has a transmitter (26), a memory (22) for storing secure data and commands and a keypad (24). The transmitter (26) is controlled so that in response to a user wishing to transfer secure data to the user apparatus (10), it transmits this data at a power level lower than that which is normally used for sending other commands. The link between the remote controller (12) and the user apparatus (10) may be wireless or infra-red.

14 Claims, 3 Drawing Sheets

METHOD OF, AND SYSTEM FOR, TRANSFERRING SECURE DATA

FIELD OF THE INVENTION

Figure 1:
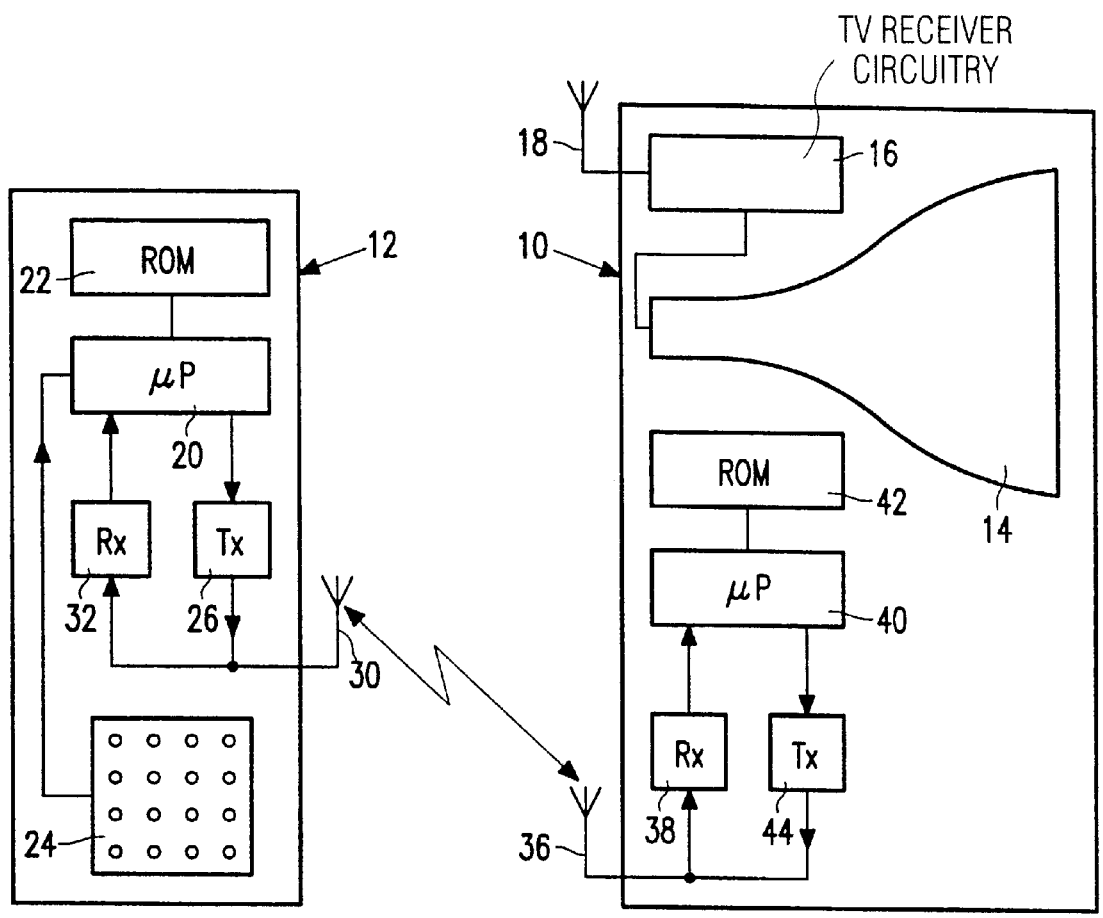

The present invention relates to a method of, and system for, transferring secure data. The present invention has particular, but not exclusive, application to the use of a remote controller for controlling a user apparatus, such as a TV receiver, audio equipment, and other items, such as domestic appliances and/or office equipment.

DESCRIPTION OF THE PREFERRED RELATED ART

The use of infra-red remote controllers to control TV receivers and audio equipment is well known. A drawback which sometimes occurs in using infra-red controllers is that there is risk of cross-coupling, for example, when a TV set remote controller sends commands to the TV receiver, which commands are picked up by other apparatus in the room causing it or them to be switched on unintentionally.

Remote controlled locking and unlocking of cars using infra-red radiation is well known, but has the disadvantage that a person equipped with what is termed "an electronic grabber" is able to detect the transmitted signal and to store it for unauthorized re-use later.

It is also known to use wireless remote controllers to operate remote apparatus having a radio receiver built into them, but drawbacks to such controllers are easy interception and the possibility of cross-coupling and spoofing, that is, commands going to the wrong apparatus or being deliberately inserted by unauthorized parties. One method to avoid these problems is by the use of security coding, but this, in turn, gives a need to set up keys and authorizations. Such a task is not looked upon as being a problem to technically adept people who may use PCs and be able to program video recorders. However entering such security data may represent a significant problem to unsophisticated users of electronic equipment.

SUMMARY OF THE INVENTION

An object of the present invention is to enter security data into a user apparatus in a simple but secure manner.

According to one aspect of the present invention, there is provided a method of transferring secure data between a remote controller and an apparatus to be controlled by said controller, comprising positioning the remote controller and the apparatus close to each other and transferring the secure data at a power level lower than that normally used for transmitting commands by the remote controller.

According to a second aspect of the present invention, there is provided a remote control system comprising a remote controller and an apparatus which is operable in response to commands relayed by way of the remote controller, the apparatus having means for receiving transmissions from the remote controller and storage means for storing secure data, and the remote controller having transmitting means, means for storing secure data and commands and a keypad, the transmitting means being responsive to the actuation of a key or combination of keys commanding the transfer of secure data, for transmitting said secure data at a power level lower than that which is used for sending other commands.

By means of the present invention, a user can place a remote controller adjacent to and spaced from the user apparatus and, by actuation of a key, can transfer the data at a very low power. Since the power used to transmit the data is very low, it would be difficult for a "grabber" to detect the data being transferred. If desired, communications between the remote controller and/or the user apparatus may be by way of radio or infra-red radiation.

Although the secure data, which may include security coding, may be held in the user apparatus or the remote controller, the security data being transmitted to the other device during the setting up procedure, an advantage for having it stored in the remote controller is that the same security data can be downloaded into several different pieces of apparatus.

If desired, the remote controller may be used to link several pieces of apparatus in a secure manner by picking up data, for example, sub-system addresses, and transferring the data to one or more apparatus which are to be linked.

In some cases it may be desirable to ensure that an authorized person is operating the remote controller. In such an arrangement, a personal indentity number (PIN) may be used to authorize the transaction. For extra security, if the PIN is transmitted, it may be encoded using pre-set coding and/or a code set up at the commencement of the operation to transfer the secure data.

In order to increase the overall security of the device, the security data may be encoded using a pseudo-random code which is automatically changed in a predetermined way so that the same information is never sent twice. The pseudo-random code in the apparatus is changed by the same algorithm as that used in the remote controller. As a result, an unauthorized person who is able to detect the transmissions cannot gain access by re-using the format of the information transmitted. The code keys and any other secret information used by these algorithms are transferred using the method in accordance with the present invention.

BRIEF DESCRIPTION OF THE INVENTION

Figure 2:
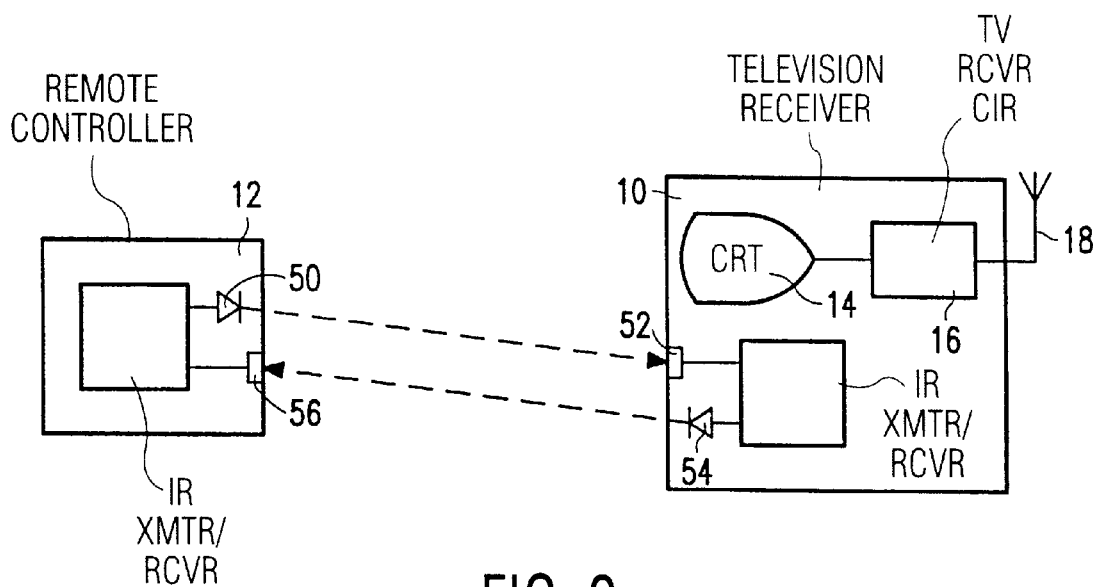
Figure 3:
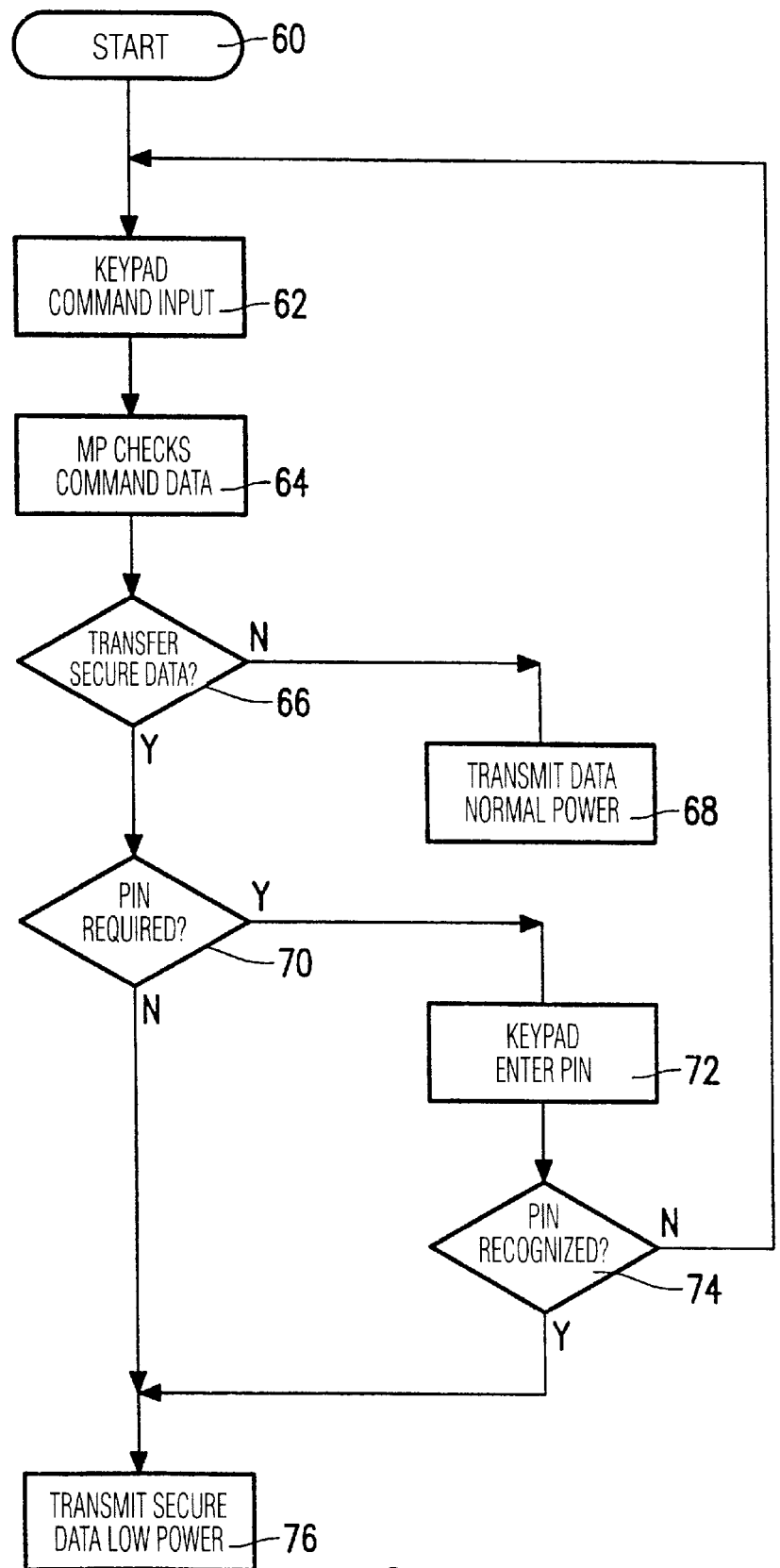
Figure 4:
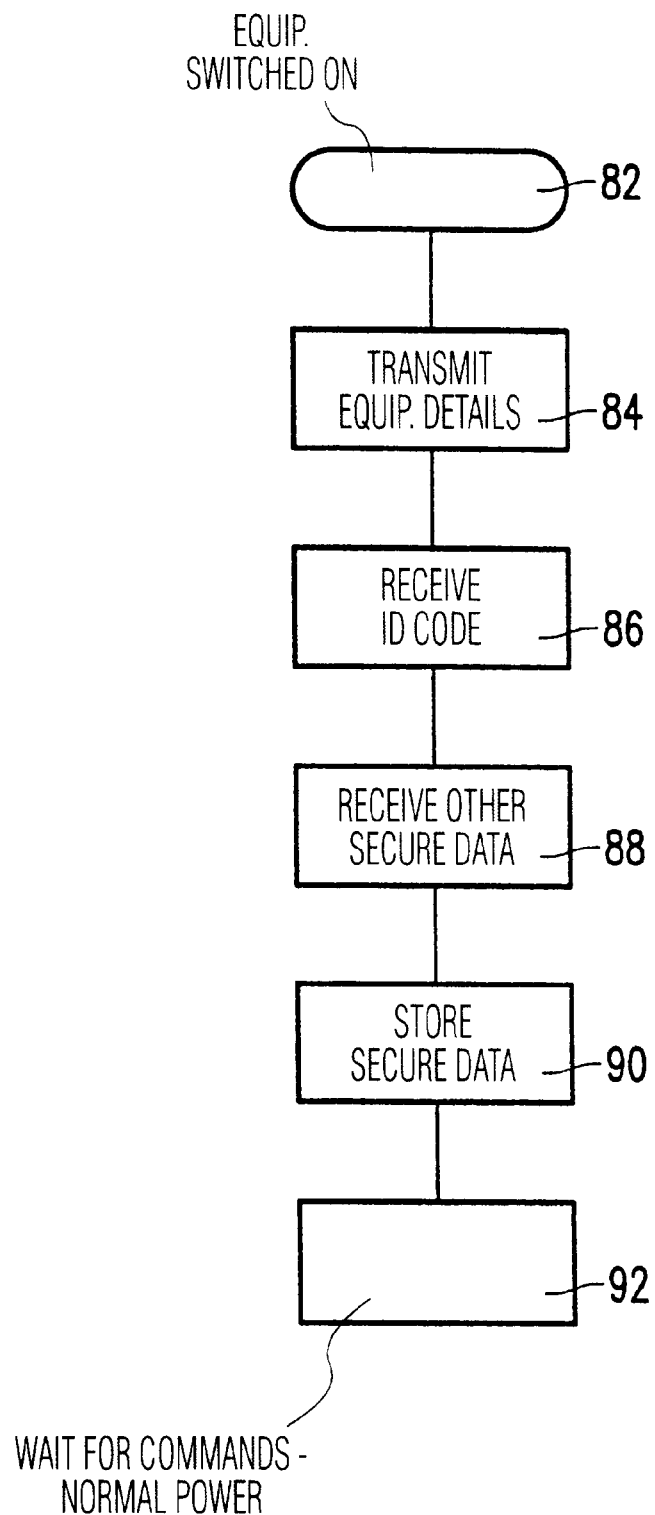

The present invention will now be described, by way of example, with reference to the accompanying drawings, wherein:

FIG. 1 is a block schematic diagram of a wireless remote controller and a TV receiver, FIG. 2 is simplified version of the drawing shown in FIG. 1 wherein the remote controller is an infra-red remote controller and transmissions from the apparatus to the remote controller are also by way of infra-red radiation, FIG. 3 is a flowchart relating to the transmission of security data by low power; and FIG. 4 is a flowchart relating to recognizing a new equipment.

In the drawings the same reference numerals have been used to indicate corresponding features.

DESCRIPTION OF THE PREFERRED EMBODIMENTS

The arrangement shown in FIG. 1 comprises a user apparatus in the form of a TV receiver 10 and a wireless remote controller 12. The TV receiver 10 comprises a display device, such as a cathode ray tube 14, to which is connected the usual television receiver circuitry 16 which is known per se and forms no part of the present invention. As is customary the circuitry 16 is connected to an antenna 18.

The remote controller 12 comprises a microprocessor 20 to which is connected a read-only memory (ROM) 22 which stores security data, such as coding. A keypad 24 is connected to the microprocessor 20 and serves as a man-machine interface. A radio transmitter 26 is provided and has an input connected to the microprocessor 20 and an output coupled to an antenna 30. A receiver 32, which may be optional, is connected between the antenna 30 and the microprocessor 20.

Inside the TV receiver 10, an antenna 36 is connected to a radio receiver 38 having an output connected to a microprocessor 40. A non-volatile ROM 42, for example, an EPROM, is connected to the microprocessor 40 and serves to store security data relayed from the remote controller 12. Optionally, a transmitter 44 is connected to an output of the microprocessor 40 and the antenna 36.

The frequency of operation of the transmitter 26 depends on that approved by the radio regulatory authorities but a frequency of the order of 400 MHz is considered suitable. The transmitter 26 is able to operate in a very low power mode, of the order of microwatts or picowatts, when relaying security data from the remote controller 12 to the receiver 38. In order to do this, the remote controller, has to be held close to the antenna 36 and separated by a space of, say, 10 cm and, by pressing a predetermined button or sequence of buttons on the remote controller 12, the remote controller transmits at low power to the receiver 38 to introduce itself. The information sent to the receiver 38 for ultimate storage in the ROM 42 includes an identity code and keys or algorithms for use as security codes in subsequent transactions at normal power. This operation could form an authorization process in which the TV receiver 10 becomes aware of the identity of the remote controller 12 and thereafter obeys its commands. An additional level of security can be provided by the remote controller storing a personal indentity number (PIN) which can be used either to authorize transmission of secure data or as part of the transactions of not only transferring security data at low power but also in the normal channel changing and other adjustments that a user may want to effect. In its most elementary form, the remote controller 12 does not include the receiver 32 and likewise the TV receiver 10 does not include the transmitter 44. By omitting these items the signalling is essentially one way from the remote controller 12 to the TV 10 receiver. However, by including the receiver 32 and the transmitter 44, information may be exchanged between the remote controller and the TV receiver and/or other equipment which are to be linked, for example, acknowledgements may be provided to transmissions originating from the remote controller 12. Such acknowledgements will also conform to the protocol applying so that transmissions at the normal, higher power do not reveal unwanted information which can be used by an unauthorized third party or another interfering apparatus. In the case of linking equipments, the remote controller 12 is able to pick-up secure data from one piece of apparatus and transfer the data at low power to one or more other pieces of apparatus, for example, to link sub-system addresses in a secure manner.

FIG. 2 is a simplified version of FIG. 1 and illustrates that communication between the remote controller 12 and the TV receiver 10 is via an infra-red link, the remote controller 12 having an infra-red emitter 50 and the TV receiver an infra-red detector 52. In order to be able to provide linking facilities and/or acknowledgements, the TV receiver 10 further comprises an infra-red emitter 54 and the remote controller an infra-red detector 56. A disadvantage of using infra-red transmissions over and above wireless transmissions is that the detector 52 and emitter 54 have to be disposed on the front of the TV receiver 10 whereas in the FIG. 1 arrangement, the antenna 36 can be placed at the rear of the apparatus and the associated circuitry located in the relatively large space surrounding the neck of the display tube 14.

FIG. 3 is a flowchart relating to the sequence of operations associated with transmitting secure data at low power from a remote controller programmed with a PIN. The flowchart commences with a terminator block 60. The block 62 relates to actuating the keypad of the remote controller to key in inputs for transferring data. The block 64 relates to the microprocessor 20 (FIG. 1) recognizing the commands in the data being transferred. Block 66 relates to checking to see if the command relates to the transfer of secure data. If the answer is No (N) then the required data is transmitted by the remote controller at normal power. This is indicated by block 68. If the answer to block 66 is Yes (Y) then in block 70 the question is asked "Is a PIN required?". If the answer is Yes (Y) then block 72 relates to a user entering his PIN and in block 74 a check is made to see if the PIN is recognized. If the answer is No (N) then the flowchart reverts to the block 62. Alternatively, if the answer is Yes (Y), then the flowchart proceeds to the block 76 which also is connected to the No (N) output of the block 70. The block 76 relates to transmitting secure data and, optionally the PIN, at low power.

Although an in-range detector may be provided, a more elementary way of checking that the data has been transferred is to send a normal power command and see if the TV receiver (or other user equipment) responds as required. In the event of the secure data not having been received, then the user re-tries with the remote controller positioned closer to the antenna or detector of the receiving equipment.

FIG. 4 relates to a flowchart in respect of a user equipment such as the TV receiver 10 (FIG. 1) receiving low power transmissions from a remote controller and having the ability to respond to inquiries made by the remote controller. Block 82 refers to switching the TV receiver on. Block 84 relates to the equipment responding by transmitting the equipment details which may include a code identifying the manufacturer, the type of equipment, for example, TV receiver, hi-fi equipment, and a type number. In block 86 the TV receiver receives the system identification code, which ensures that the transmission was intended for the TV receiver, transmitted by the remote controller which is followed by receiving additional secure data such as security coding, algorithms and so forth, block 88. Block 90 refers to storing the secure data, for example, in the ROM 42 (FIG. 1). Finally, block 92 relates to the TV receiver waiting to receive commands at normal power level from the remote controller.

By means of the present invention, one remote controller can be used to operate several pieces of equipment which form parts of a home system network or in an office environment. Additionally, by means of the creation of a network of equipment and the use of security coding, equipment can "talk" to each other without additional commands from the remote controller.

Although the present invention envisages a wireless or infra-red link between the remote controller and the user apparatus, other known forms of communication, such as ultrasonics, or ohmic contact may be used for the transfer of secure information. In the case of using ohmic contact, then either a special connector can be provided between the remote controller and the user apparatus or the user apparatus has a storage compartment for receiving the remote controller, the storage compartment and the remote controller having complementary electrical contacts which mate when the remote controller is inserted into the storage compartment.

From reading the present disclosure, other variations and modifications will be apparent to persons skilled in the art. Such variations and modifications may involve equivalent and other features which are already known in the design, manufacture and use of remote control systems and component parts thereof, and which may be used instead of or in addition to features already described herein. Although claims have been formulated in this application to particular combinations of features, it should be understood that the scope of the disclosure of the present invention also includes any novel feature or any novel combination of features disclosed herein either explicitly or implicitly or any generalization thereof, whether or not it relates to the same invention as presently claimed in any claim and whether or not it mitigates any or all of the same technical problems as does the present invention. Applicants hereby give notice that new claims may be formulated to such features and/or combinations of such features during the prosecution of the present application or of any further application derived therefrom.

What is claimed is:

1. A method of transferring secure data between a remote controller and a user apparatus in a secure manner, the remote controller having means for storing the secure data, transmitting means, and means for controlling the output power of the transmitting means to have at least a low output power level and a high output power level, the user apparatus having receiving means and means to store secure data received by said receiving means, wherein the remote controller transmits operational commands for effecting operation of the user apparatus across an air interface using a communications link while said controlling means controls said transmitting means to transmit at said high output power level, characterized in that said method comprises the steps:

storing said secure data in said storing means in said remote controller;

placing the remote controller in a position closer to the user apparatus than a position used when said remote controller is transmitting said operational commands; and transmitting said secure data across said air interface using said communications link from said remote controller to said user apparatus using said transmitting means at said low output power level, wherein a personal identification number (PIN) is stored in the remote controller, characterized in that the method further comprises the steps:

a user entering the PIN into the remote controller;

comparing the entered PIN with the PIN stored in the remote controller; and enabling the transmitting means only if the entered PIN corresponds to the stored PIN.

2. A method as claimed in claim 1, characterized in that the user apparatus comprises transmitting means and the remote controller comprises receiving means allowing data communication to the remote controller by the communication link.

3. A method as claimed in claim 2, for use in a system having at least two pieces of user apparatus, characterized in that the remote controller receives data from one piece of apparatus and transfers said data to at least another piece of the at least two pieces of user apparatus.

4. A remote control system comprising a remote controller and a user apparatus; the remote controller including means for storing secure data, means for storing operational commands for effecting operation of the user apparatus, transmitting means, means for controlling the output power of the transmitting means to have at least a low output power level and at least a high output power level, and a keypad, and the user apparatus having means for storing secure data, wherein the controlling means, in response to appropriate actuation of the keypad, causes the transmitting means to transmit the secure data only at the low output power level and to transmit the commands only at the high output power level, characterized in that the remote controller has means for storing a PIN number and the user apparatus has means for storing the PIN number when received as part of the transaction for transferring the secure data.

5. A remote control system comprising a remote controller and a user apparatus; the remote controller including means for storing secure data, means for storing operational commands for effecting operation of the user apparatus, transmitting means, means for controlling the output power of the transmitting means to have at least a low output power level and at least a high output power level, and a keypad; and the user apparatus having means for storing secure data, wherein the controlling means, in response to appropriate actuation of the keypad, causes the transmitting means to transmit the secure data only at the low output power level and to transmit the commands only at the high output power level, characterized in that the user apparatus comprises transmitting means and the remote controller comprises receiving means, allowing data communication to the remote controller by the user apparatus.

6. A method of transferring secure data between a remote controller and a user apparatus in a secure manner, the remote controller having means for storing the secure data, transmitting means, and means for controlling the output power of the transmitting means to have at least a low output power level and a high output power level, the user apparatus having receiving means and means to store secure data received by said receiving means, wherein the remote controller transmits operational commands for effecting operation of the user apparatus across an air interface using a communications link while said controlling means controls said transmitting means to transmit at said high output power level, characterized in that said method comprises the steps:

storing said secure data in said storing means in said remote controller;

placing the remote controller in a position closer to the user apparatus than a position used when said remote controller is transmitting said operational commands; and transmitting said secure data across said air interface using said communications link from said remote controller to said user apparatus using said transmitting means at said low output power level, wherein said method further comprises the steps:

generating a pseudo-random code in the remote controller;

encoding the secure data using the pseudo-random code;

transmitting the encoded secure data from the remote controller to the user apparatus;

generating the same pseudo-random code in the user apparatus;

decoding the received encoded secure data using said pseudo-random code generated in the user apparatus; and changing the pseudo-random code in both the remote controller and the user apparatus after each transmission in accordance with a predetermined algorithm, and wherein a personal identification number (PIN) is stored in the remote controller, characterized in that the method further comprises the steps:
 a user entering the PIN into the remote controller;
 comparing the entered PIN with the PIN stored in the remote controller; and
 enabling the transmitting means only if the entered PIN corresponds to the stored PIN.

7. A method of transferring secure data between a remote controller and a user apparatus in a secure manner, the remote controller having means for storing the secure data, transmitting means, and means for controlling the output power of the transmitting means to have at least a low output power level and a high output power level, the user apparatus having receiving means and means to store secure data received by said receiving means, wherein the remote controller transmits operational commands for effecting operation of the user apparatus across an air interface using a communications link while said controlling means controls said transmitting means to transmit at said high output power level, characterized in that said method comprises the steps:
 storing said secure data in said storing means in said remote controller;
 placing the remote controller in a position closer to the user apparatus than a position used when said remote controller is transmitting said operational commands; and
 transmitting said secure data across said air interface using said communications link from said remote controller to said user apparatus using said transmitting means at said low output power level,
 wherein said communications link is radio signals, and wherein a personal identification number (PIN) is stored in the remote controller,
 characterized in that the method further comprises the steps:
  a user entering the PIN into the remote controller;
  comparing the entered PIN with the PIN stored in the remote controller; and
  enabling the transmitting means only if the entered PIN corresponds to the stored PIN.

8. A method of transferring secure data between a remote controller and a user apparatus in a secure manner, the remote controller having means for storing the secure data, transmitting means, and means for controlling the output power of the transmitting means to have at least a low output power level and a high output power level, the user apparatus having receiving means and means to store secure data received by said receiving means, wherein the remote controller transmits operational commands for effecting operation of the user apparatus across an air interface using a communications link while said controlling means controls said transmitting means to transmit at said high output power level, characterized in that said method comprises the steps:
 storing said secure data in said storing means in said remote controller;
 placing the remote controller in a position closer to the user apparatus than a position used when said remote controller is transmitting said operational commands; and
 transmitting said secure data across said air interface using said communications link from said remote controller to said user apparatus using said transmitting means at said low output power level,
 wherein said method further comprises the steps:
  generating a pseudo-random code in the remote controller;
  encoding the secure data using the pseudo-random code;
  transmitting the encoded secure data from the remote controller to the user apparatus;
  generating the same pseudo-random code in the user apparatus;
  decoding the received encoded secure data using said pseudo-random code generated in the user apparatus; and
  changing the pseudo-random code in both the remote controller and the user apparatus after each transmission in accordance with a predetermined algorithm,
 wherein said communication link is radio signals, and wherein a personal identification number (PIN) is stored in the remote controller,
 characterized in that the method further comprises the steps:
  a user entering the PIN into the remote controller;
  comparing the entered PIN with the PIN stored in the remote controller; and
  enabling the transmitting means only if the entered PIN corresponds to the stored PIN.

9. A remote control system comprising a remote controller and a user apparatus; the remote controller including means for storing secure data, means for storing operational commands for effecting operation of the user apparatus, transmitting means, means for controlling the output power of the transmitting means to have at least a low output power level and at least a high output power level, and a keypad; and the user apparatus having means for storing secure data, wherein the controlling means, in response to appropriate actuation of the keypad, causes the transmitting means to transmit the secure data only at the low output power level and to transmit the commands only at the high output power level, characterized in that the transmitting and receiving means are radio transmitting and receiving means, and the remote controller has means for storing a PIN number, and the user apparatus has means for storing the PIN number when received as part of the transaction for transferring the secure data.

10. A remote control system comprising a remote controller and a user apparatus; the remote controller including means for storing secure data, means for storing operational commands for effecting operation of the user apparatus, transmitting means, means for controlling the output power of the transmitting means to have at least a low output power level and at least a high output power level, and a keypad; and the user apparatus having means for storing secure data, wherein the controlling means, in response to appropriate actuation of the keypad, causes the transmitting means to transmit the secure data only at the low output power level and to transmit the commands only at the high output power level, characterized in that the transmitting and receiving means are radio transmitting and receiving means, and the user apparatus comprises transmitting means and the remote controller comprises receiving means, allowing data communication to the remote controller by the user apparatus.

11. A system as claimed in claim 4, characterized in that the user apparatus comprises transmitting means and the remote controller comprises receiving means, allowing data communication to the remote controller by the user apparatus.

12. A system as claimed in claim 9, characterized in that the user apparatus comprises transmitting means and the remote controller comprises receiving means, allowing data communication to the remote controller by the user apparatus.

13. A method of transferring secure data between a remote controller and a user apparatus in a secure manner, the remote controller having means for storing the secure data, transmitting means, and means for controlling the output power of the transmitting means to have at least a low output power level and a high output power level, the user apparatus having receiving means and means to store secure data received by said receiving means, wherein the remote controller transmits operational commands for effecting operation of the user apparatus across an air interface using a communications link while said controlling means controls said transmitting means to transmit at said high output power level, wherein said method comprises the steps:

storing said secure data in said storing means in said remote controller;

placing the remote controller in a position closer to the user apparatus than a position used when said remote controller is transmitting said operational commands; and transmitting said secure data across said air interface using said communications link from said remote controller to said user apparatus using said transmitting means at said low output power level, characterized in that said method further comprises the steps:

generating a pseudo-random code in the remote controller;

encoding the secure data using the pseudo-random code;

transmitting the encoded secure data from the remote controller to the user apparatus;

generating the same pseudo-random code in the user apparatus;

decoding the received encoded secure data using said pseudo-random code generated in the user apparatus; and changing the pseudo-random code in both the remote controller and the user apparatus after each transmission in accordance with a predetermined algorithm.

14. A method as claimed in claim 13, characterized in that the communication link is radio signals.

* * * * *